(12) United States Patent
Hikmet et al.

(10) Patent No.: US 9,777,890 B2
(45) Date of Patent: Oct. 3, 2017

(54) LIGHTING MODULE AND METHOD OF MANUFACTURING A LIGHTING MODULE

(71) Applicant: PHILIPS LIGHTING HOLDING B.V., Eindhoven (NL)

(72) Inventors: Rifat Ata Mustafa Hikmet, Eindhoven (NL); Ties van Bommel, Eindhoven (NL); Jianghong Yu, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/381,240

(22) PCT Filed: Feb. 27, 2013

(86) PCT No.: PCT/IB2013/051563
§ 371 (c)(1),
(2) Date: Aug. 27, 2014

(87) PCT Pub. No.: WO2013/132389
PCT Pub. Date: Sep. 12, 2013

(65) Prior Publication Data
US 2015/0103521 A1    Apr. 16, 2015

Related U.S. Application Data

(60) Provisional application No. 61/607,058, filed on Mar. 6, 2012.

(51) Int. Cl.
*F21K 99/00*    (2016.01)
*H01L 25/075*    (2006.01)
(Continued)

(52) U.S. Cl.
CPC ................. *F21K 9/13* (2013.01); *F21K 9/23* (2016.08); *F21K 9/90* (2013.01); *F21V 19/002* (2013.01);
(Continued)

(58) Field of Classification Search
CPC ...... F21S 2/005; F21S 48/115; F21S 48/1154; F21S 48/215; F21V 29/004; F21V 15/01;
(Continued)

(56) References Cited

U.S. PATENT DOCUMENTS 5,528,474 A * 6/1996 Roney .................. B60Q 1/2696
257/E25.028
6,318,886 B1 * 11/2001 Stopa ........................ F21K 9/00
257/E25.028
(Continued)

FOREIGN PATENT DOCUMENTS

CN      101546715 A     9/2009
DE      102004057804 A1  6/2006
(Continued)

*Primary Examiner* — Hargobind S Sawhney

(57) ABSTRACT

A lighting module (150) and a method (100) of manufacturing a lighting module, wherein the method comprises the steps of providing a heat sink material (120) in a fluid state and providing a light-source assembly (110) comprising a plurality of light sources (111) being electrically connected to a carrier (112), wherein each of the light sources has a light-emitting surface (113). The method further comprises the steps of embedding (130) the light-source assembly into the heat sink material such that the carrier and a part of each of the light sources are covered by the heat sink material while the light-emitting surface of each of the light sources is uncovered by the heat sink material, and solidifying (140) the heat sink material.

13 Claims, 8 Drawing Sheets

(51) Int. Cl.
*H01L 33/64* (2010.01)
*F21K 9/90* (2016.01)
*F21V 19/00* (2006.01)
*F21V 23/06* (2006.01)
*F21K 9/23* (2016.01)
*H01L 33/56* (2010.01)
*H01L 33/62* (2010.01)
*F21S 8/06* (2006.01)
*F21Y 101/00* (2016.01)
*F21Y 115/10* (2016.01)

(52) U.S. Cl.
CPC .......... *F21V 23/06* (2013.01); *H01L 25/0753* (2013.01); *H01L 33/641* (2013.01); *F21S 8/06* (2013.01); *F21Y 2101/00* (2013.01); *F21Y 2115/10* (2016.08); *H01L 33/56* (2013.01); *H01L 33/62* (2013.01); *H01L 33/642* (2013.01); *H01L 33/644* (2013.01); *H01L 2924/0002* (2013.01); *H01L 2933/0066* (2013.01); *H01L 2933/0075* (2013.01)

(58) Field of Classification Search
CPC ...... F21V 19/001; F21V 29/85; F21V 19/002; F21V 29/22; F21Y 2101/02; F21Y 2103/003; G02B 6/0021; H05K 2201/10106; H05K 2201/066; H05K 2201/096681; H05K 2201/09681; B60Q 1/26; F21K 9/90; F21K 9/13; H01L 25/0753; H01L 2933/0075; H01L 33/56
See application file for complete search history.

(56) References Cited

U.S. PATENT DOCUMENTS

| | | | |
|---|---|---|---|
| 7,441,925 B2 * | 10/2008 | Chou | F21K 9/00 362/249.01 |
| 2005/0243558 A1 * | 11/2005 | Van Duyn | F21V 29/763 362/294 |
| 2006/0198128 A1 | 9/2006 | Piepgras | |
| 2008/0067666 A1 * | 3/2008 | Hsu | H01L 21/6835 257/700 |
| 2008/0298033 A1 * | 12/2008 | Smith | H01R 4/2404 361/772 |
| 2009/0161354 A1 * | 6/2009 | Hsu | F21K 9/00 362/227 |

FOREIGN PATENT DOCUMENTS

| | | | | |
|---|---|---|---|---|
| JP | 1991151674 A | 6/1991 | | |
| JP | 1994326144 A | 11/1994 | | |
| JP | 2005159296 A | 6/2005 | | |
| JP | 2006257295 A | 9/2006 | | |
| JP | 2007189116 A | 7/2007 | | |
| JP | 2009161742 A | 7/2009 | | |
| JP | 2009535799 A | 10/2009 | | |
| JP | 2010093285 A | 4/2010 | | |
| JP | 2011522414 A | 7/2011 | | |
| KR | 101144202 B1 * | 5/2012 | | H01L 33/54 |
| WO | WO2004109814 A1 | 12/2004 | | |
| WO | 2007149362 A2 | 12/2007 | | |
| WO | 2010035206 A1 | 4/2010 | | |
| WO | 2010102685 A1 | 9/2010 | | |
| WO | 2012095812 A2 | 7/2012 | | |

* cited by examiner

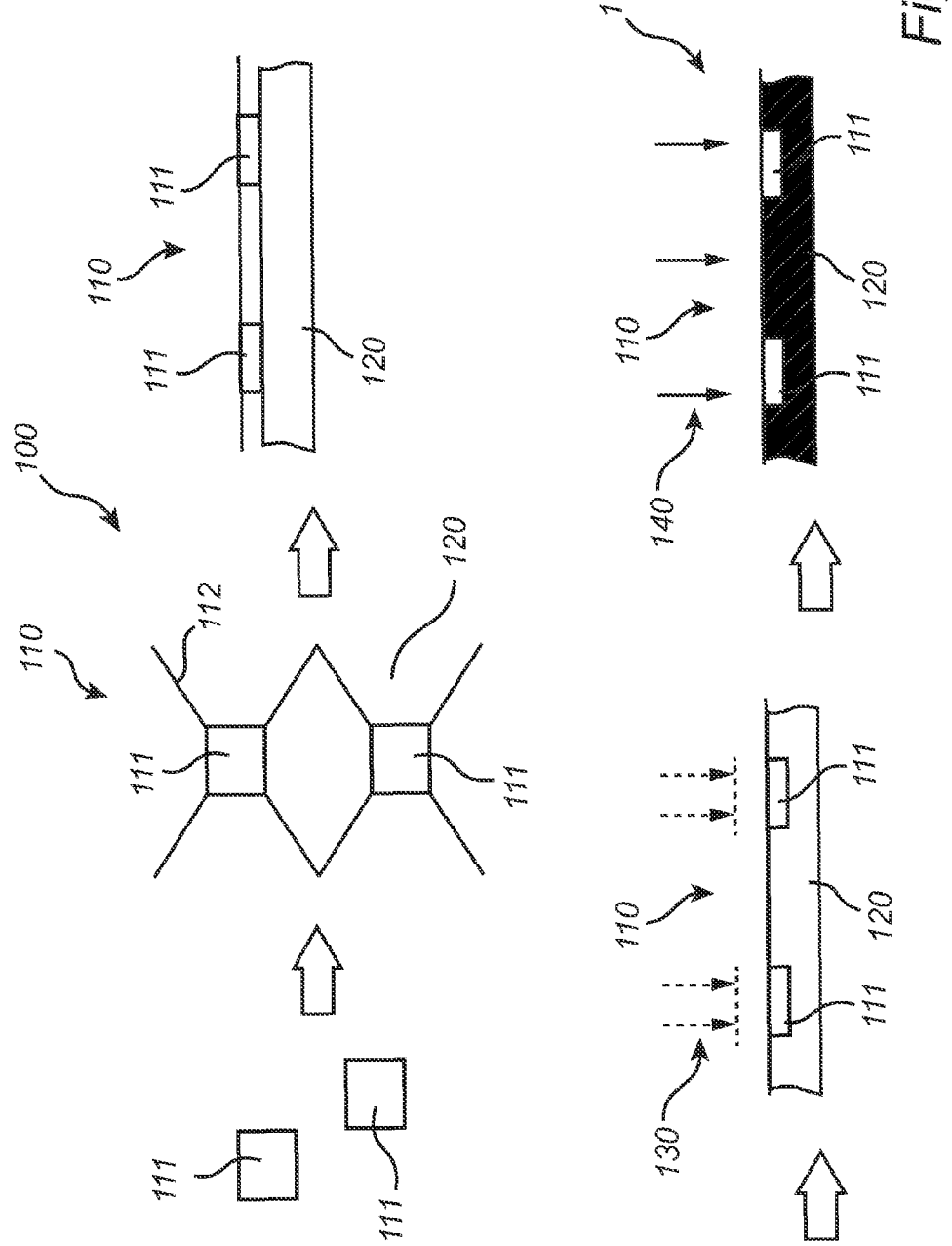

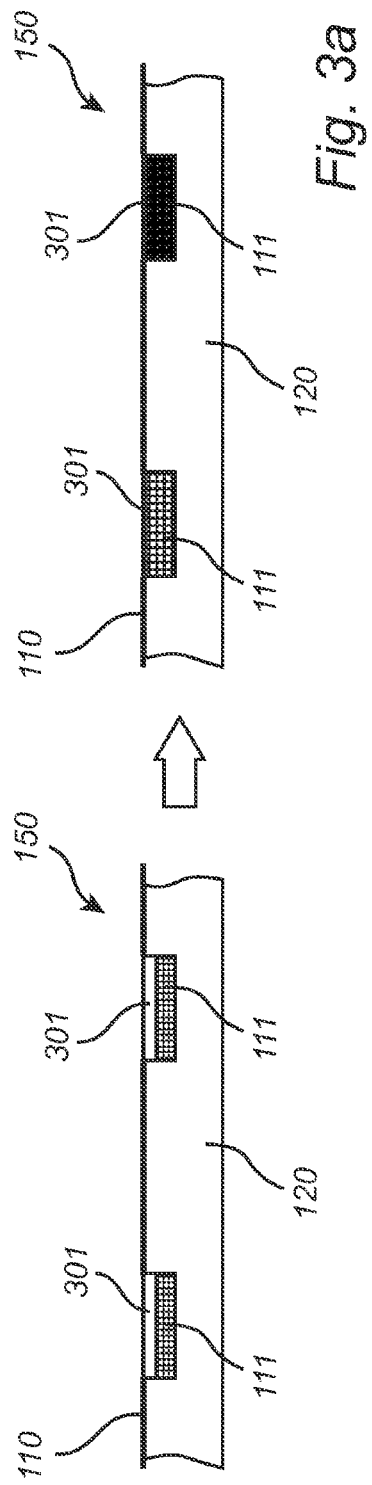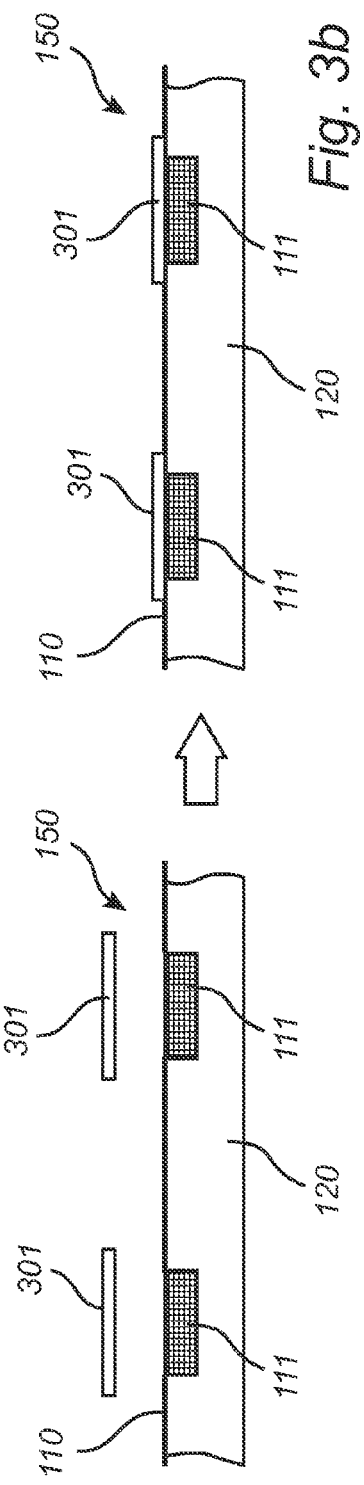

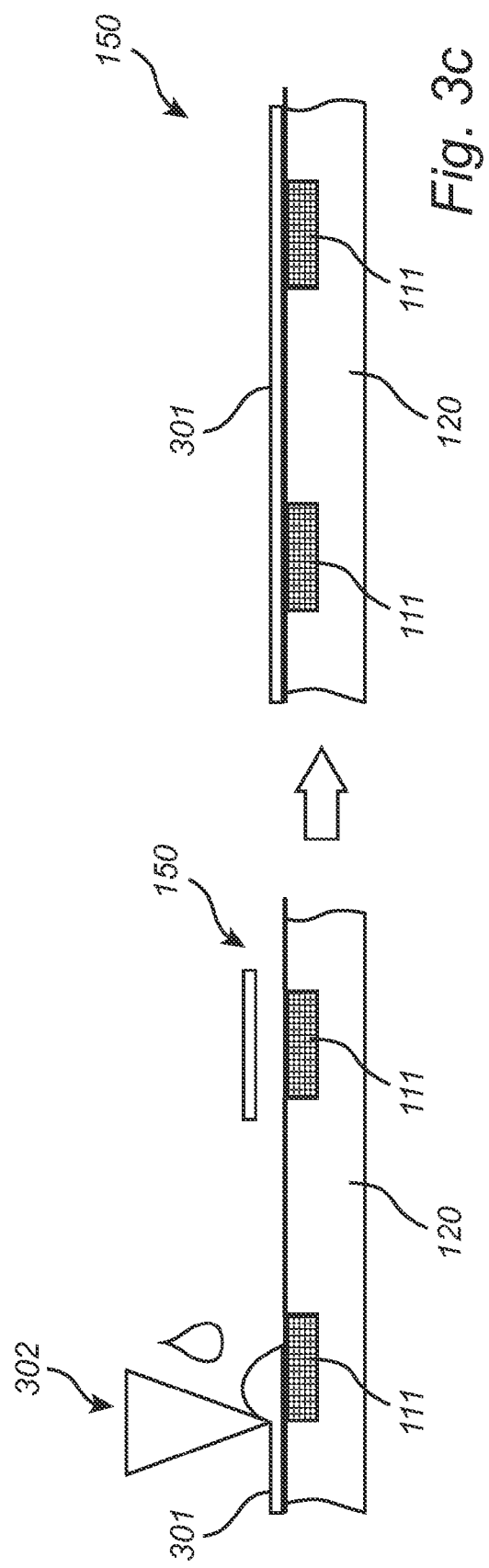

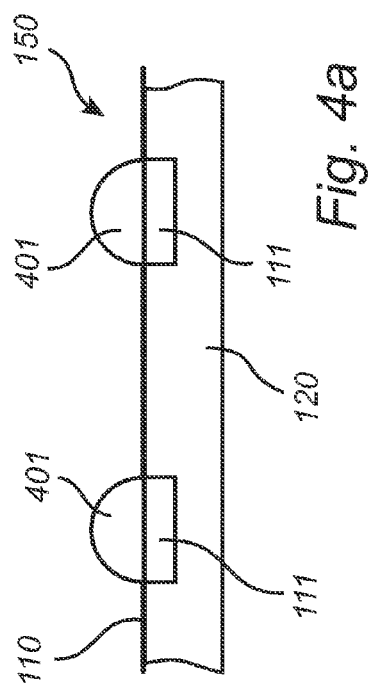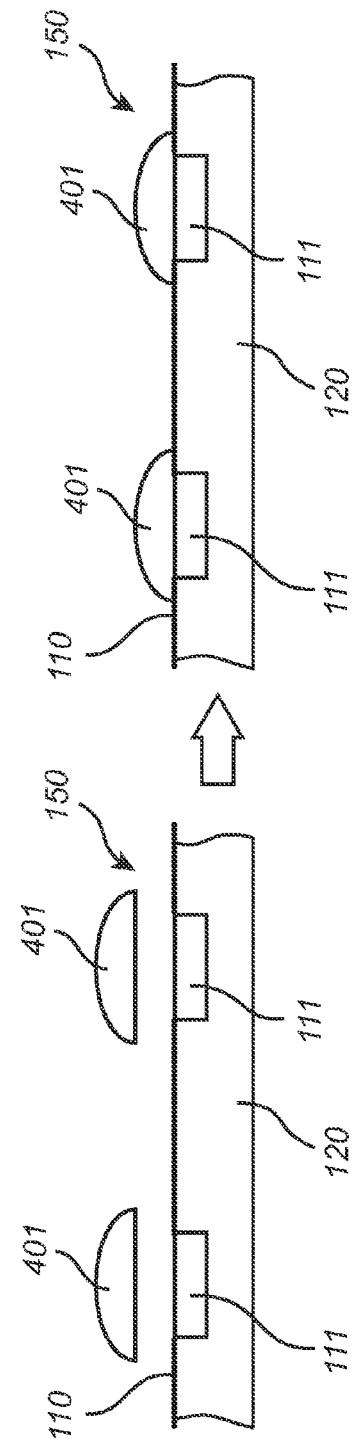

LIGHTING MODULE AND METHOD OF MANUFACTURING A LIGHTING MODULE

CROSS-REFERENCE TO PRIOR APPLICATIONS

This application is the U.S. National Phase application under 35 U.S.C. §371 of International Application No. PCT/IB2013/051563, filed on Feb. 27, 2013, which claims the benefit of U.S. Patent Application No. 61/607058, filed on Mar. 6, 2012. These applications are hereby incorporated by reference herein.

FIELD OF THE INVENTION

The present invention relates to a lighting module and to a method of manufacturing a lighting module.

BACKGROUND OF THE INVENTION

Common to light sources such as light-emitting diodes (LEDs), light bulbs, laser diodes and lamps is that the light sources emit heat. Light-emitting arrangements comprising a plurality of light sources, e.g. for use in a display or in an illumination device, may generate a quick rise of the temperature of the light-emitting arrangement, especially if many light sources are driven at the same time. The effect of heat may be detrimental to the light sources, and their operation may become erratic and unstable. As a consequence, the light from the light source may flicker, causing degradation of the quality of the display or illumination. Hence, thermal management is an important issue to prevent thermal damage of the light sources, and it is necessary to dissipate excess heat in order to maintain the reliability of the light-emitting arrangement and to prevent premature failure of the light sources.

However, the manufacture of heat sinks for the dissipation of heat for light-emitting arrangements is associated with relatively high costs, and a large fraction of the cost of light-emitting arrangements is related to the heat sinks and the procedure of assembling together the light sources with the heat sink.

In the light of the above observations, there is an increasing need for a cost-effective manufacture of light-emitting arrangements having heat dissipation properties.

DE 10 2004 057 804 discloses a housing body for a semiconductor chip and a method for the production thereof. A lead frame, having a mounting surface for the arrangement of a semiconductor chip, is applied with an adhesive layer and placed into a mould. The lead frame may further be provided with a coating of silver, gold or nickel-palladium. A ceramic material such as aluminum oxide or zirconium oxide, is poured into the mould such that the material surrounds the lead frame and forms a housing body of the lead frame.

However, the method of producing the housing body for each semiconductor chip is inefficient, complicated and circumstantial. As a consequence, the manufactured product becomes relatively expensive. Hence, alternative solutions for the manufacture of electronic products having an effective heat dissipation are of interest, such that a more cost-effective manufacture, as well as the product resulting from the manufacture, is provided.

SUMMARY OF THE INVENTION

It is an object of the present invention to mitigate the above problems and to provide a method for manufacturing a lighting module, as well as a lighting module, which is cost-effective.

This and other objects are achieved by providing a lighting module and a method having the features defined in the independent claims. Preferred embodiments are defined in the dependent claims.

Hence, according to a first aspect of the present invention, there is provided a method of manufacturing a lighting module. The method comprises the step of providing a heat sink material in a fluid state. Further, the method comprises the step of providing a light-source assembly comprising a plurality of light sources being electrically connected to a carrier, wherein each of the light sources has a light-emitting surface. Further, the method comprises the step of embedding the light-source assembly into the heat sink material such that the carrier and a part of each of the light sources are covered by the heat sink material while the light-emitting surface of each of the light sources is uncovered by the heat sink material. Further, the method comprises the step of solidifying the heat sink material.

According to a second aspect of the present invention, there is provided a lighting module, comprising a light-source assembly. The light-source assembly comprises a plurality of light sources being electrically connected to a carrier, wherein each of the light sources has a light-emitting surface. The lighting module further comprises a heat sink material, wherein the carrier and a part of each of the light sources are covered by the heat sink material while the light-emitting surface of each of the light sources is uncovered by the heat sink material.

By the term "fluid state", it is here meant a state of the heat sink material which is able to conform to the light-source assembly. More specifically, it will be appreciated that in this context, the "fluid state" of the heat sink material represents a liquid heat sink material with a relatively high viscosity, wherein the heat sink material is in a non-gaseous state.

By the term "carrier", it is here meant substantially any electrically conductive element for supplying electricity to the light sources.

By the term "light-emitting surface", it is here meant a surface from which light is emitted by the light-source.

By the term "solidifying", it is here meant to make a material solid, for example through hardening, curing and/or tempering.

By the term "luminaire", it is here meant an electrical device for creating artificial light, e.g. a light fixture, a light fitting or the like.

Thus, the present invention is based on the idea of providing a method for manufacturing a lighting module, wherein a light-source assembly, comprising a plurality of light sources being electrically connected to a carrier, is partly embedded (immersed) into the fluid heat sink material. The light-source assembly is embedded such that the carrier and a part of each of the light sources are covered (embedded) by the heat sink material, whereas the light-emitting surface of each of the light sources remains uncovered by the heat sink material. Then, the heat sink material is solidified to fix the light-source assembly in the heat sink material. The present invention thereby provides an efficient and cost-effective method of manufacturing a lighting module comprising a light-source assembly and a heat sink structure arranged to dissipate heat generated by the light sources, when in operation.

An advantage of various embodiments of the present invention is that the method provides good thermal contact between the light sources (e.g. LEDs), the carrier and the heat sink material in a rational and production-friendly way. Moreover, a large quantity of light sources may be embedded either simultaneously or after each other into the heat sink material, by machine or by hand. The present method is thereby more efficient compared to methods wherein electrical components are held in a mould, or the like, and material is filled into the mould to surround the components. Whereas methods of this latter kind result in a slow and troublesome procedure, and especially when components are processed one-by-one, the present invention provides an easier, faster and/or more cost-effective method for providing heat sinks structures for the dissipation of heat from light sources.

Another advantage is that the carrier, to which the light sources are connected, may be adapted to e.g. the size, number and concentration of the light sources which are to be embedded and/or be adapted to the properties of the heat sink material. Hence, the carrier to an even further extent facilitates the embedding of the light-source assembly into the fluid (soft, viscous) heat sink material.

Another advantage achievable through various embodiments of the present invention is that fewer process steps and/or less material is needed in the method when providing the light source assembly with the heat sink material compared to methods in the prior art. As a consequence, the present method provides a more cost-effective method for manufacturing the lighting module as well as an inexpensive lighting module. Furthermore, the method provides a more environmental-friendly approach compared to prior art methods, as less material is used when manufacturing the lighting module.

Another advantage obtainable through various embodiments of the present invention is that the heat sink material may be chosen to be a cost-effective (inexpensive) material, having at least sufficient and/or satisfactory heat-sinking properties. Hence, by the choice of heat sink material, the method for manufacturing the lighting module, as well as the lighting module itself, becomes even more cost-effective compared to methods/products in the prior art. Furthermore, as less material may be used when manufacturing the lighting module compared to prior art methods, the method of the present invention even further decreases manufacturing costs.

According to an embodiment of the present invention, the heat sink material may be non-transparent. Hence, in this embodiment, the heat sink material is non-translucent, and the light emitted from the light sources is partly or completely transmitted through the light-emitting surface of the light sources. Since the light-emitting surface is left uncovered by the heat sink material, the embodiment is advantageous in that non-transparent heat sink materials may be used, which reduces the cost considerably as compared to transparent heat sink materials, which would have been necessary had the light-emitting surface been covered by the heat sink material.

According to an embodiment of the present invention, the heat sink material may comprise at least one ceramic material. An advantage of the present embodiment is that ceramic materials are relatively inexpensive and easily accessible and/or producible, even further contributing to the cost-effectiveness of the present method. A further advantage of the present embodiment is that ceramic materials provide a satisfactory and/or sufficient heat conductivity for the purpose of dissipating heat from the light sources of the lighting module of the present invention during operation.

According to an embodiment of the present invention, the at least one ceramic material may be chosen from a group consisting of clay, concrete and porcelain. The ceramic materials clay, concrete and/or porcelain are highly advantageous for the use as a cost-effective heat sink material in the present method and lighting module, as the ceramic materials are both inexpensive and possess heat-conductive properties. Other ceramics which may be considered as heat sink material are oxide ceramics (e.g. alumina, beryllia, ceria, zirconia), nonoxide ceramics (carbide, boride, nitride, silicide) and composite materials, e.g. combinations of oxide and nonoxide ceramics.

According to an embodiment of the present invention, the carrier may comprise a wire grid. By the term "wire grid", it is here meant substantially any grid/mesh-like structure, framework, or the like. The wire grid may comprise wires, lines and/or cables. An advantage of the present embodiment is that the grid structure of the carrier saves material compared to a carrier having a more homogeneous (unitary) structure (e.g. a circuit board or the like), thereby providing an even more cost-efficient method and lighting module. Furthermore, as the present embodiment uses less material, an even more environmental-friendly method and lighting module is provided. The present embodiment is advantageous in that the carrier, comprising a wire grid, provides a lighter lighting module compared to more homogeneous carriers. Furthermore, the grid-like structure of the carrier of the present embodiment allows for an improved embedding of the carrier into the heat sink material compared to other arrangements in the prior art. Consequently, the carrier is able to provide an improved heat transfer to the heat sink material.

The carrier may further comprise a lead frame. An advantage of the lead frame is that the electrically conductive carrier may provide a firm support for the light sources. Further, the lead-frame carrier may have a sparse construction in which it provides an even more cost-efficient method and lighting module, compared to a carrier having a more homogeneous structure (e.g. a circuit board or the like), in terms of material savings. The lead frame is further advantageous in that the sparse construction of the lead frame allows for an improved embedding of the carrier into the heat sink material compared to other prior art arrangements. The carrier, which may be provided in various thicknesses and sizes, is thereby able to provide an improved heat transfer to the heat sink material.

The light sources of the lighting module may be light-emitting diodes (LED) or laser diodes. The use of LEDs and laser diodes is beneficial in that they present several advantages over incandescent light sources, including lower energy consumption, longer lifetime, improved robustness, smaller size and the use of more environmental-friendly materials for an improved recycling. Hence, an even more efficient and cost-effective method and lighting module may be provided.

According to an embodiment of the present invention, the method may further comprise the step of applying a phosphor layer on at least one of the light sources. The applying of a phosphor material is advantageous in that it may be used to convert a light of a first wavelength range to a light of a second wavelength range, e.g. a monochromatic light from a blue or ultraviolet (UV) LED to a white light. The present embodiment is further advantageous in that the phosphor layer may efficiently and easily be applied on the light-emitting surface of the light source, either before embedding the light-source assembly into the heat sink material or after the light-source assembly has been embedded in the heat sink material. Hence, the embodiment thereby even further improves the (cost)-efficiency of the method and the lighting module according to various embodiments of the present invention.

According to an embodiment of the present invention, the method further comprises the step of applying an optical structure on at least one of the light sources. The optical structure, e.g. a dome structure, applied on the light-emitting surface of the light source may further efficiently improve the light distribution. An advantage of the present embodiment is that the optical structure may efficiently and easily be applied on the light-emitting surface of the light source, either before or after the embedding the light-source assembly into the heat sink material, leading to an even more efficient method of manufacturing the lighting module.

According to an embodiment of the present invention, the method may further comprise the step of applying a protective layer on at least one of the light sources. An advantage of the present embodiment is that the protective layer efficiently protects the light sources in case further processing steps are performed. The protective layer may be applied on the light source either before or after embedding the light-source assembly into the heat sink material, and the (cost)-efficiency of the method and the lighting module of the present invention may thereby be even further improved.

According to an embodiment of the present invention, the step of embedding may comprise the step of pressing the light-source assembly into the heat sink material in the fluid state by means of a pressing means comprising a base portion and at least one protruding portion which protrudes from the base portion. The at least one protruding portion is arranged to press the at least one light source into the heat sink material at the light-emitting surface of the at least one light source to prevent the heat sink material from covering the light-emitting surface.

The pressing means is hereby arranged to press the light-source assembly into the heat sink material such that the means forms the heat sink material according to the profile of the means. An advantage of the present embodiment is that the pressing means of the embodiment of the present invention may press the light-source assembly into the heat sink material while simultaneously forming the heat sink material in the fluid state into a desired form. Hence, the present embodiment even further contributes to the cost-efficiency of the method of manufacturing the lighting module.

According to an embodiment of the present invention, the heat sink material may be shaped by the pressing means upon the pressing of the light-source assembly into the heat sink material to form a cavity around the at least one light source. An advantage of the present embodiment is that the heat sink material hereby provides a cavity of the at least one light source, which e.g. may serve as a mixing chamber for the lighting module.

According to an embodiment of the present invention, the step of solidifying may comprise the step of polymerizing the heat sink material. In other words, the fluid heat sink, into which the light-source assembly has been embedded, is hardened by polymerization. The efficiency of polymerization provides the advantage that solidifying the heat sink material by means of this technique even further contributes to the cost-efficiency of the method of the present invention.

According to an embodiment of the present invention, the step of solidifying may comprise the step of heating the heat sink material. In other words, after the light-source assembly has been embedded into the fluid heat sink material, the heat sink material is hardened by heating (baking). The present embodiment is advantageous in that solidifying the heat sink material by applying heat implies an easy, efficient and inexpensive solidification of the heat sink material, thereby providing an even more cost-efficient method of the present invention.

According to an embodiment of the present invention, the step of solidifying may comprise the step of pressurizing the heat sink material. In this embodiment, the fluid heat sink, into which the light-source assembly has been embedded, is hardened by applying (additional) pressure to the heat sink material. The applied pressure lowers the melting temperature of the heat sink material, and provides an efficient solidification of the heat sink material.

According to an embodiment of the present invention, there is provided an illumination device, comprising at least one lighting module according to the previously described embodiment. The illumination device further comprises a connector being electrically connected to the carrier of the at least one lighting module, wherein the connector is arranged for connection to a luminaire. Hence, in the present embodiment, the lighting module may be arranged in a illumination device for connection to a luminaire such as a lamp or the like. The present embodiment is advantageous in that the concept of the cost-effective lighting module, comprising a light-source assembly and a heat sink structure arranged to dissipate heat generated by the light sources, is further applicable for illumination devices for connection to luminaires.

It will be appreciated that the specific embodiments and any additional features described above with reference to the method of manufacturing the lighting module are likewise applicable and combinable with the lighting module according to the second aspect of the present invention.

BRIEF DESCRIPTION OF THE DRAWINGS

These and other aspects of the present invention will now be described in more detail, with reference to the appended drawings showing a currently preferred embodiment of the invention, wherein:

FIG. 1 is a schematic illustration of a method of manufacturing a lighting module according to an embodiment of the present invention, FIGS. 3-7 are schematic side-view illustrations of a method of manufacturing a lighting module according to embodiments of the present invention.

DETAILED DESCRIPTION OF THE EMBODIMENTS

Figure 2A:
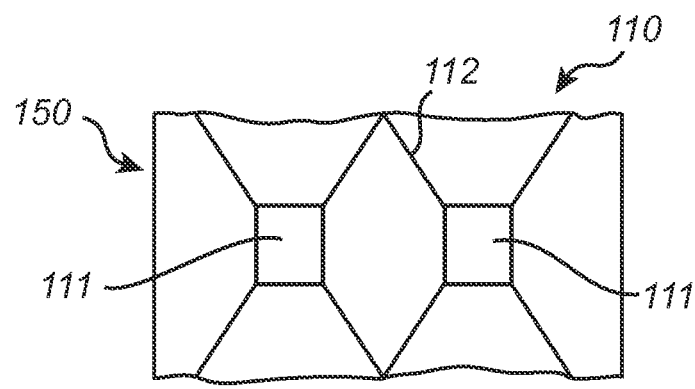
FIGS. 2*a-b* are schematic views from above of a lighting module according to an embodiment of the present invention.

In the following description, the present invention is described with reference to a method of manufacturing a lighting module.

FIG. 1 is a schematic illustration of a method 100 for manufacturing a lighting module 150. The method 100 comprises the step of providing a light-source assembly 110 comprising a plurality of light sources 111 (hereafter denoted LEDs) being electrically connected to a carrier 112. Here, the carrier 112 is provided as a wire grid upon which the LEDs 111 are connected, wherein the wire grid has the shape of a chicken wire. However, it will be appreciated that substantially any shape of the wire grid may be feasible. Each of the LEDs 111 has a light-emitting (i.e. translucent) surface on a top portion of the LEDs 111. The method 100 further comprises the step of providing a heat sink material 120 in a fluid state, wherein examples of heat sink materials 120 may be ceramics. Preferred ceramics are e.g. clay, concrete, quartz, porcelain, etc., as these ceramic materials are both inexpensive and possess heat-conductive properties, thereby being highly advantageous for the use as a cost-effective heat sink material 120 in the present method 100 and lighting module 150. Other ceramics which may be considered as heat sink material 120 are oxide ceramics (e.g. alumina, beryllia, ceria, zirconia), nonoxide ceramics (carbide, boride, nitride, silicide) and composite materials, e.g. combinations of oxide and nonoxide ceramics. The heat sink material 120 in the fluid state may be supplied to a mould or the like arranged for holding and/or shaping the heat sink material.

The method 100 further comprises the step of embedding 130 the light-source assembly 110 into the heat sink material 120. The embedding 130 is performed in such a way that the carrier 110 and a part of each of the LEDs 111 are covered by the heat sink material 120 while the light-emitting surface 113 of each of the LEDs 111 is uncovered by the heat sink material 120. The embedding 130 may be performed by applying pressure to the light-source assembly 110 such that it is pressed into the heat sink material 120. Further, the method 100 comprises the step of solidifying 140 the heat sink material 120, i.e. making the heat sink material solid 140. The step of solidifying 140 the heat sink material 120 may be performed by using a step comprising polymerizing, heating (baking) or pressurizing (or a combination thereof) of the heat sink material 120. After the heat sink material 120 is made solid, it provides the light-source assembly 110 (i.e. the carrier 110 and the LEDs 111) with the required stiffness for fixation.

Figure 2B:
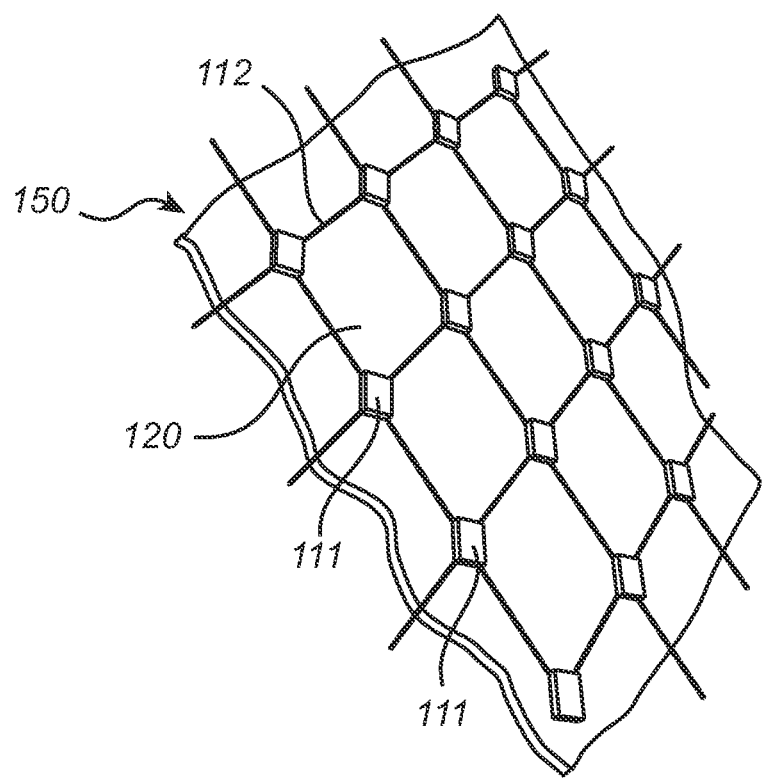

FIGS. 2a-b are schematic illustrations from above of the lighting module 150, comprising the light-source assembly 110 embedded into the solidified heat sink material 120. Here, the wire grid of the carrier 112 of the light-source assembly 110 has the shape of a chicken wire.

FIGS. 3a-c are schematic side-view illustrations of the lighting module 150 comprising the light-source assembly 110 embedded into the solidified heat sink material 120. In FIG. 3a, a phosphor layer 301 is applied to each of the LEDs 111 before embedding the lighting module 110 in the heat sink material 120. The phosphor layer(s) 301 is (are) applied for the purpose of converting a light of a first wavelength to a light of a second wavelength. As an example, the resulting color of one (or more) of the LEDs 111 after applying the phosphor layer 301 may be any color, e.g. red (e.g. leftmost LED 111 in FIG. 3a), whereas the resulting color of any other (or more) of the LEDs 111 may be the same, or any other color, e.g. green (e.g. rightmost LED 111 in FIG. 3a).

In FIGS. 3b-c, a phosphor layer 301 is instead applied to the LEDs 111 after embedding the lighting module 110 in the heat sink material 120. In FIG. 3b, the phosphor layers 301 are applied as separate layers on each of the LEDs 111, whereas in FIG. 3c, the phosphor layer 301 is instead applied to the surface of the lighting module 150 and thereafter coated (and/or spread and/or smeared) onto the surface of the lighting module 150 by means of a coating element 302.

FIGS. 4a-b are schematic side-view illustrations of the lighting module 150 comprising the light-source assembly 110 embedded into the solidified heat sink material 120. In FIG. 4a, a dome-shaped optical structure 401 is applied to each LED 111 before embedding the lighting-source assembly 110 in the heat sink material 120. Alternatively, the optical structures 401 may instead be applied to the LEDs 111 after embedding the light-source assembly 110 in the heat sink material 120, which is shown in FIG. 4b.

Figure 5:
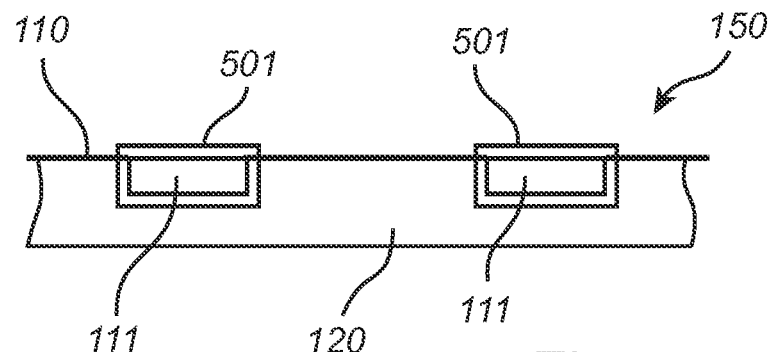

FIG. 5 is again a schematic side-view illustration of the lighting module 150 comprising the light-source assembly 110 embedded into the solidified heat sink material 120. Here, a protective layer 501 is applied around the LEDs 111 for protecting the LEDs 111 when subjected to (possible) further manufacturing steps.

Figure 6:
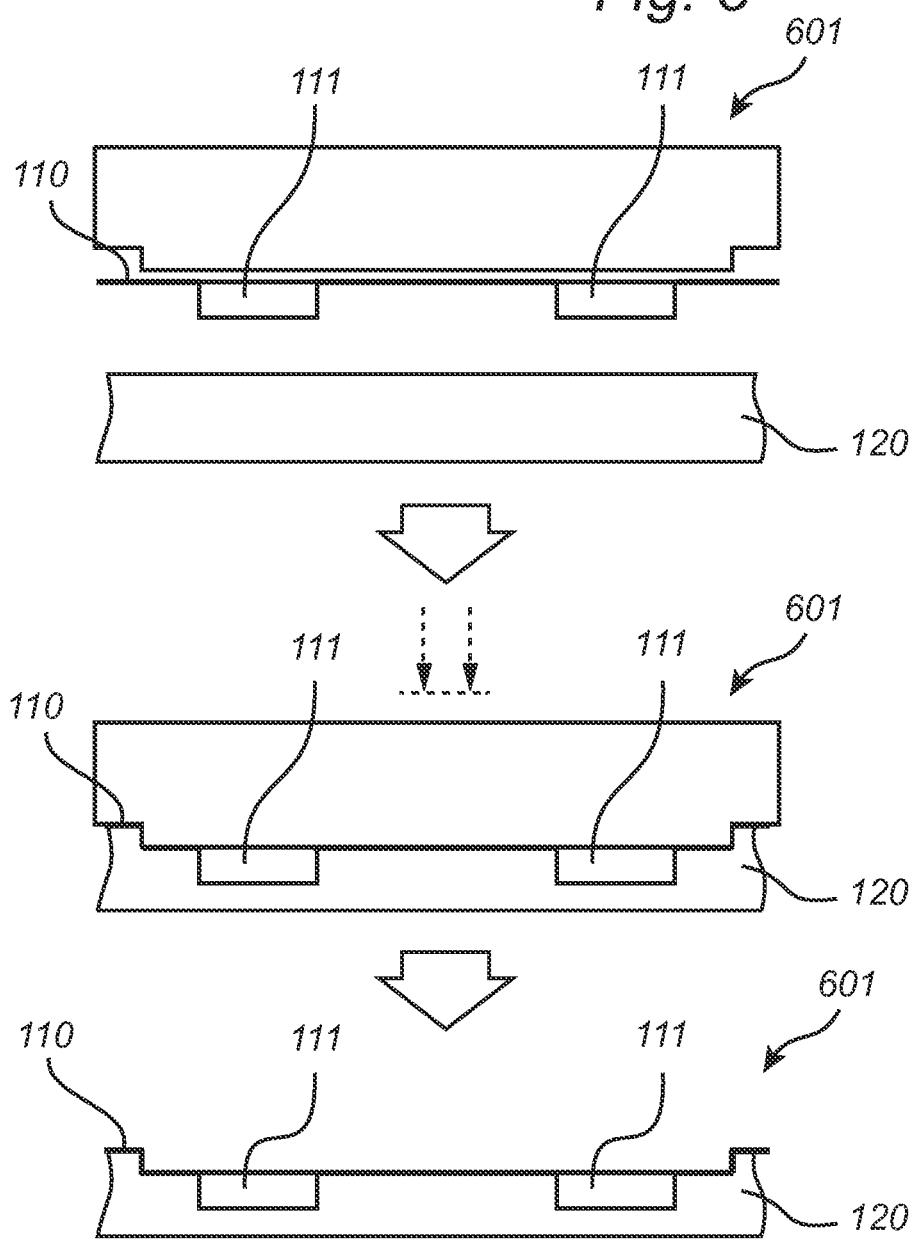

FIG. 6 is a schematic side-view illustration of an embodiment of the method of manufacturing the lighting module 150. The light-source assembly 110 is pressed into the heat sink material 120 by means of a profile-shaped pressing means 601. Here, the pressing means 601 comprises steps, such that when the pressing means 601 is pressed into the heat sink material 120 in its fluid state, the resulting shape of the lighting module 150 and/or heat sink material 120 is formed after the step-like profile of the pressing means 601. For example, the resulting lighting module 150 and heat sink material 120 may be shaped such that the LEDs 111 of the lighting module 150 are provided in a lower portion of the heat sink material 120 than the surrounding heat sink material 120. This profile of the heat sink material 120 may, as an example, provide a mixing chamber 602 for the lighting module 150. However, it will be appreciated that the pressing means 601 may comprise substantially any shape for forming a desired shape/profile in the fluid heat sink material 120.

Figure 7:
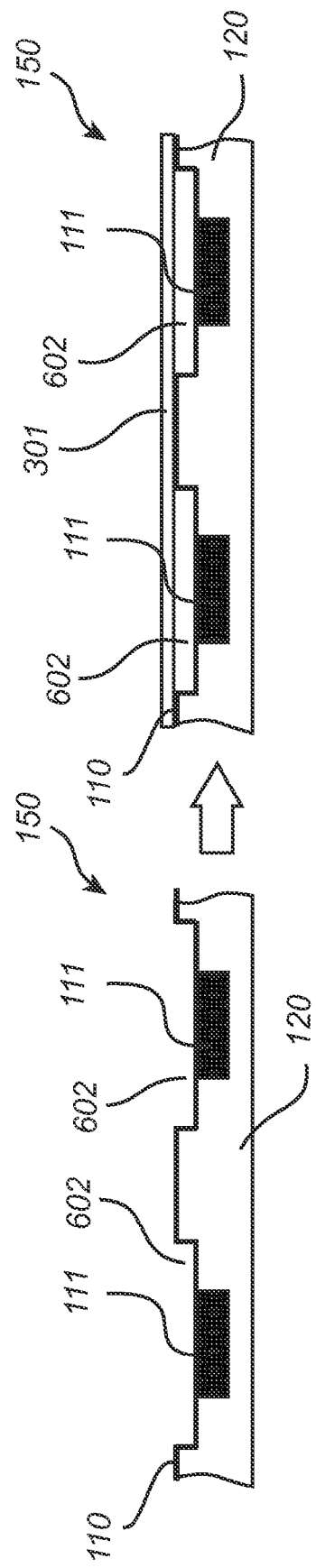

It will be appreciated that any step of the method of manufacturing the lighting module 150 as described may be combined with any other step (or steps) as described and/or be applied to any number of components (e.g. LEDs 111). For example, in FIG. 7, a lighting module 150 has been provided with multiple mixing chambers 602, e.g. after having been subjected to a profile-shaped pressing means. Furthermore, after the mixing chambers 602 have been provided, a phosphor layer 301 is applied to the lighting module 150, providing a space of the mixing chambers 602 between the LEDs 111 and the phosphor layer 301.

Figure 8:
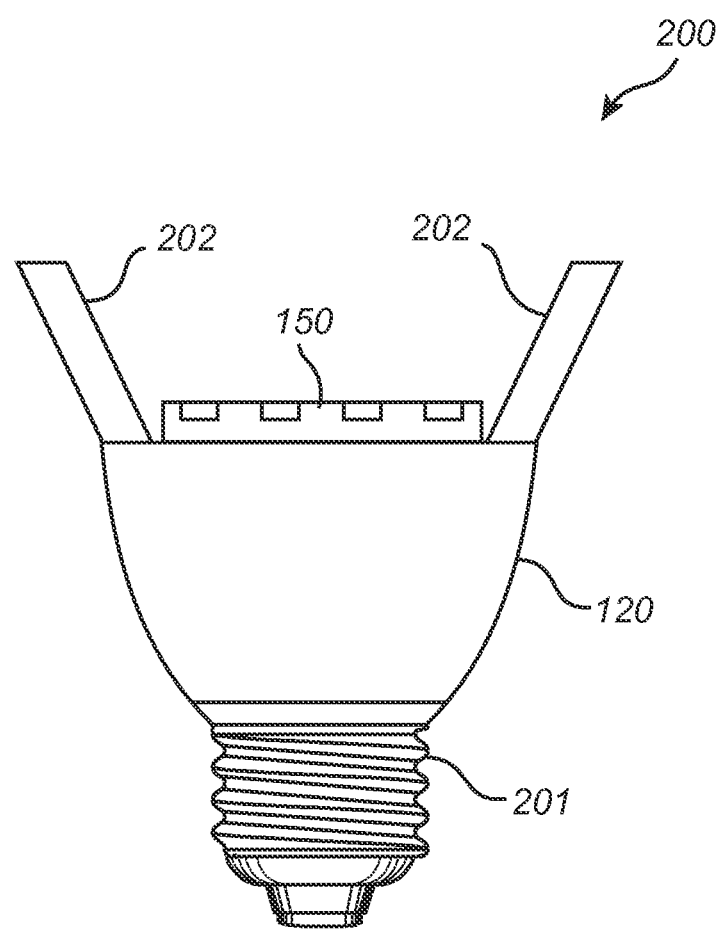
FIG. 8 is a schematic illustration of an illumination device according to an embodiment of the present invention.

FIG. 8 is a schematic illustration of an illumination device 200 comprising a lighting module 150 with a heat sink material 120. The illumination device 200 further comprises a connector 201 which is electrically connected to the carrier (not shown) of the lighting module 150. The connector 201 is arranged for electrical connection, e.g. to a socket, such that the illumination device 200 may be connected to a luminaire such as a lamp or the like. Optionally, one or more reflecting elements 202 may be provided in the illumination device 200. FIG. 8 shows a cut view of a reflecting element 202 projecting from the heat sink material 120 and being arranged to reflect light from the light sources of the lighting module 150. It will be appreciated that although the illumination device 200 is shown in FIG. 8 in a shape similar to a light bulb, the illumination device 200 may also take on virtually any other shape, e.g. for the purpose of being arranged in a luminaire to be suspended from a ceiling.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

For example, the shapes and sizes of the LEDs 111, carrier 112, heat sink material 120 after solidifying, optical elements 401, phosphor layer 301, and so on, may be different from that shown.

The invention claimed is:

1. A method of manufacturing a lighting module, comprising the steps of:
   providing a heat sink material in a fluid state;
   providing a light-source assembly comprising a plurality of light sources being electrically connected to an electrically conductive carrier, each of the light sources having a light-emitting surface;
   pressing the light-source assembly into the heat sink material such that the electrically conductive carrier and a part of each of the light sources are covered by the heat sink material while the light-emitting surface of each of the light sources is uncovered by the heat sink material; and
   solidifying the heat sink material.

2. The method as claimed in claim 1, wherein the heat sink material is non-transparent.

3. The method as claimed in claim 1, wherein the heat sink material comprises at least one ceramic material.

4. The method as claimed in claim 3, wherein the at least one ceramic material is chosen from the group consisting of clay, concrete and porcelain.

5. The method as claimed in claim 1, wherein the electrically conductive carrier comprises a wire grid.

6. The method as claimed in claim 1, further comprising the step of applying a phosphor layer on at least one of the light sources.

7. The method as claimed in claim 1, further comprising the step of applying an optical structure on at least one of the light sources.

8. The method as claimed in claim 1, further comprising the step of applying a protective layer on at least one of the light sources.

9. The method as claimed in claim 1, wherein the step of pressing comprises pressing the light-source assembly into the heat sink material in the fluid state by means of a pressing means comprising a base portion and at least one protruding portion which protrudes from the base portion, wherein the at least one protruding portion is arranged to press at least one light source of the plurality of light sources into the heat sink material at the light-emitting surface of the at least one light source to prevent the heat sink material from covering the light-emitting surface of the at least one light source.

10. The method as claimed in claim 9, wherein the heat sink material is shaped by the pressing means upon the pressing of the light-source assembly into the heat sink material to form a cavity around the at least one light source.

11. The method as claimed in claim 1, wherein the step of solidifying comprises the step of polymerizing the heat sink material.

12. The method as claimed claim 1, wherein the step of solidifying comprises the step of heating the heat sink material.

13. A method of manufacturing a lighting module, comprising the steps of:
   providing a heat sink material in a fluid state;
   providing a light-source assembly comprising a plurality of light sources being electrically connected to an electrically conductive carrier, each of the light sources having a light-emitting surface;
   embedding the light-source assembly into the heat sink material such that the electrically conductive carrier and a part of each of the light sources are covered by the heat sink material while the light-emitting surface of each of the light sources is uncovered by the heat sink material; and
   solidifying the heat sink material, wherein the step of solidifying comprises the step of pressurizing the heat sink material.

* * * * *